(12) United States Patent
Chen (10) Patent No.: US 12,231,121 B2
(45) Date of Patent: Feb. 18, 2025

(54) MULTI-BIT LEVEL SHIFTER WITH SHARED ENABLE SIGNALS

(71) Applicant: MEDIATEK INC., Hsinchu (TW)

(72) Inventor: Sz-Han Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 18/063,731

(22) Filed: Dec. 9, 2022

(65) Prior Publication Data

US 2023/0223937 A1    Jul. 13, 2023

Related U.S. Application Data

(60) Provisional application No. 63/297,265, filed on Jan. 7, 2022.

(51) Int. Cl.
     *H03K 19/0185*    (2006.01)
     *H03K 3/037*    (2006.01)

(52) U.S. Cl.
     CPC ..... *H03K 19/018521* (2013.01); *H03K 3/037* (2013.01)

(58) Field of Classification Search
     CPC ..... H03K 19/00315; H03K 19/018507; H03K 19/018521; H03K 3/356104; H03K 3/356113; H03K 3/356182
     See application file for complete search history.

(56) References Cited

U.S. PATENT DOCUMENTS

| | | | |
|---|---|---|---|
| 5,933,386 A | 8/1999 | Walker et al. | |
| 11,063,593 B2 | 7/2021 | Ramarajan | |
| 11,456,744 B1 * | 9/2022 | Ding | H03K 3/356113 |
| 2007/0014061 A1 | 1/2007 | Chang et al. | |
| 2020/0103957 A1 | 4/2020 | Venugopal et al. | |
| 2020/0350916 A1 | 11/2020 | Ou et al. | |
| 2021/0344343 A1 | 11/2021 | Ramarajan | |

FOREIGN PATENT DOCUMENTS

EP    102 402 A1    5/2001

OTHER PUBLICATIONS

Extended European Search Report dated Jun. 9, 2023, issued in application No. EP 23150567.8.
Chinese language office action dated Jul. 26, 2023, issued in application No. TW 112100750.

* cited by examiner

*Primary Examiner* — Patrick O Neill
(74) *Attorney, Agent, or Firm* — McClure, Qualey & Rodack, LLP (57) ABSTRACT

A circuit includes a control inverter, a first latch circuit, and a second latch circuit. The control inverter receives a control signal to generate a reverse control signal. The first latch circuit is activated by the reverse control signal to convert a first input signal ranging from the first supply voltage to the ground into a first output signal ranging from the second supply voltage to the ground. The second latch circuit is activated by the reverse control signal to convert a second input signal ranging from a first supply voltage to the ground into a second output signal ranging from the second supply voltage to the ground. The first supply voltage and the second supply voltage are different.

18 Claims, 8 Drawing Sheets

MULTI-BIT LEVEL SHIFTER WITH SHARED ENABLE SIGNALS

CROSS REFERENCE TO RELATED APPLICATIONS

This application claims the benefit of U.S. Provisional Application No. 63/297,265, filed on Jan. 7, 2022, the entirety of which is incorporated by reference herein.

BACKGROUND OF THE INVENTION

Field of the Invention

The disclosure is generally related to a multi-bit level shifter with shared enable signals.

Description of the Related Art

Level shifters are widely used components in digital circuits for communicating between two different power domains, one being a low-voltage domain and the other being a high-voltage domain. As the requirements on level shifters for circuits increase, the amount of chip area taken up by the level shifters becomes more significant. Therefore, how to reduce the area of a multi-bit level shifter should be addressed.

BRIEF SUMMARY OF THE INVENTION

Many architectures of a multi-bit level shifter are provided herein. Since all N latch circuits share the same control inverter for generating the reverse control signal, (N−1) inverters or (N−1)*2 transistors are reduced, which may be a significant reduction when N is a significant number. The output signals of the multi-bit level shifter may be pulled to the supply voltage or the ground for preventing the output signals from floating. The invention also provides a space-saving way to eliminate the antenna effect as well as an area-efficient layout for the multi-bit level shifter to not only improve ESD performance but also reduce the overall chip area.

In an embodiment, a circuit comprises a control inverter, a first latch circuit, and a second latch circuit. The control inverter receives a control signal to generate a reverse control signal. The reverse control signal is an inverse of the control signal. The first latch circuit is activated by the reverse control signal to convert a first input signal ranging from a first supply voltage to a ground into a first output signal ranging from a second supply voltage to the ground. The second latch circuit is activated by the reverse control signal to convert a second input signal ranging from the first supply voltage to the ground into a second output signal ranging from the second supply voltage to the ground. The first supply voltage and the second supply voltage are different.

According to an embodiment of the invention, the circuit further comprises a first input inverter, a second input inverter, a third input inverter, and a fourth input inverter. The first input inverter receives the first input signal to generate a first reverse input signal. The second input inverter receives the first reverse input signal to generate a second reverse input signal. The third input inverter receives the second input signal to generate a third reverse input signal. The fourth input inverter receives the third reverse input signal to generate a fourth reverse input signal. The first input inverter, the second input inverter, the third input inverter, and the fourth input inverter are supplied by the first supply voltage.

According to an embodiment of the invention, the first latch circuit comprises a first P-type transistor, a second P-type transistor, a third P-type transistor, a fourth P-type transistor, a first N-type transistor, a second N-type transistor, a third N-type transistor, and a fourth N-type transistor. The first P-type transistor comprises a control terminal, a first terminal, and a second terminal. The control terminal is coupled to a first cross-coupled node, and the first terminal is coupled to the second supply voltage. The second P-type transistor comprises a control terminal, a first terminal, and a second terminal. The control terminal is coupled to the second cross-coupled node, and the first terminal is coupled to the second supply voltage. The third P-type transistor comprises a control terminal, a first terminal, and a second terminal. The control terminal receives the first reverse input signal. The first terminal is coupled to the second terminal of the first P-type transistor. The second terminal is coupled to the second cross-coupled node. The first output signal is generated at the second cross-coupled node. The fourth P-type transistor comprises a control terminal, a first terminal, and a second terminal. The control terminal receives the second reverse input signal, the first terminal is coupled to the second terminal of the second P-type transistor, and the second terminal is coupled to the first cross-coupled node. The first N-type transistor comprises a control terminal, a first terminal, and a second terminal. The control terminal receives the reverse control signal, and the first terminal is coupled to the ground. The second N-type transistor comprises a control terminal, a first terminal, and a second terminal. The control terminal receives the first reverse input signal, the first terminal is coupled to the second terminal of the first N-type transistor, and the second terminal is coupled to the second cross-coupled node. The third N-type transistor comprises a control terminal, a first terminal, and a second terminal. The control terminal receives the reverse control signal, and the first terminal is coupled to the ground. The fourth N-type transistor comprises a control terminal, a first terminal, and a second terminal. The control terminal receives the second reverse input signal, the first terminal is coupled to the second terminal of the third N-type transistor, and the second terminal is coupled to the first cross-coupled node.

According to an embodiment of the invention, the second latch circuit comprises a fifth P-type transistor, a sixth P-type transistor, a seventh P-type transistor, an eighth P-type transistor, a fifth N-type transistor, a sixth N-type transistor, a seventh N-type transistor, and an eighth N-type transistor. The fifth P-type transistor comprises a control terminal, a first terminal, and a second terminal, where the control terminal is coupled to a third cross-coupled node, and the first terminal is coupled to the second supply voltage. The sixth P-type transistor comprises a control terminal, a first terminal, and a second terminal. The control terminal is coupled to a fourth cross-coupled node, and the first terminal is coupled to the second supply voltage. The seventh P-type transistor comprises a control terminal, a first terminal, and a second terminal. The control terminal receives the third reverse input signal, the first terminal is coupled to the second terminal of the fifth P-type transistor, and the second terminal is coupled to the fourth cross-coupled node. The eighth P-type transistor comprises a control terminal, a first terminal, and a second terminal. The control terminal receives the fourth reverse input signal, the first terminal is coupled to the second terminal of the sixth P-type transistor, and the second terminal is coupled to the third cross-coupled node. The second output signal is generated at the third cross-coupled node. The fifth N-type transistor comprises a control terminal, a first terminal, and a second terminal. The control terminal receives the reverse control signal, and the first terminal is coupled to the ground. The sixth N-type transistor comprises a control terminal, a first terminal, and a second terminal. The control terminal receives the third reverse input signal, the first terminal is coupled to the second terminal of the fifth N-type transistor, and the second terminal is coupled to the fourth cross-coupled node. The seventh N-type transistor comprises a control terminal, a first terminal, and a second terminal. The control terminal receives the reverse control signal, and the first terminal is coupled to the ground. The eighth N-type transistor comprises a control terminal, a first terminal, and a second terminal. The control terminal receives the fourth reverse input signal, the first terminal is coupled to the second terminal of the seventh N-type transistor, and the second terminal is coupled to the third cross-coupled node.

According to an embodiment of the invention, the first latch circuit further comprises a first off transistor. The first off transistor provides the second supply voltage to the second cross-coupled node according to the reverse control signal. The second latch circuit further comprises a second off transistor. The second off transistor provides the second supply voltage to the third cross-coupled node according to the reverse control signal.

According to an embodiment of the invention, when the control signal is at a high logic level and the reverse control signal is at a low logic level, the first N-type transistor, the third N-type transistor, the fifth N-type transistor, and the seventh N-type transistor are turned off, and the first off transistor and the second off transistor are turned on to respectively provide the second supply voltage to the first output signal and the second output signal. When the control signal is at a low logic level and the reverse control signal is at a high logic level, the first N-type transistor, the third N-type transistor, the fifth N-type transistor, and the seventh N-type transistor are turned on and the first off transistor and the second off transistor are turned off, so that the first latch circuit and the second latch circuit operate normally.

According to an embodiment of the invention, the first latch circuit further comprises a third off transistor. The third off transistor couples the first cross-coupled node to the ground according to the control signal. The second latch circuit further comprises a fourth off transistor. The fourth off transistor couples the fourth cross-coupled node to the ground according to the control signal.

According to an embodiment of the invention, when the control signal is at a high logic level and the reverse control signal is at a low logic level, the first N-type transistor, the third N-type transistor, the fifth N-type transistor, and the seventh N-type transistor are turned off, and the first off transistor, the second off transistor, the third off transistor, and the fourth off transistor are turned on. The second supply voltage is provided to the first output signal and the second output signal, and the first cross-coupled node and the fourth cross-coupled node are coupled to the ground.

According to another embodiment of the invention, when the control signal is at a low logic level and the reverse control signal is at a high logic level, the first N-type transistor, the third N-type transistor, the fifth N-type transistor, and the seventh N-type transistor are turned on and the first off transistor, the second off transistor, the third off transistor, and the fourth off transistor are turned off, so that the first latch circuit and the second latch circuit operate normally.

According to yet another embodiment of the invention, the first latch circuit further comprises a fifth off transistor and a sixth off transistor. The fifth off transistor couples the first output signal to the ground according to the control signal. The sixth off transistor provides the second supply voltage to the first cross-coupled node according to the reverse control signal. The second latch circuit further comprises a seventh off transistor and an eighth off transistor. The seventh off transistor provides the second supply voltage to the fourth cross-coupled node according to the reverse control signal. The eighth off transistor couples the second output signal to the ground according to the control signal.

According to an embodiment of the invention, when the control signal is at a high logic level and the reverse control signal is at a low logic level, the first N-type transistor, the third N-type transistor, the fifth N-type transistor, and the seventh N-type transistor are turned off, and the fifth off transistor, the sixth off transistor, the seventh off transistor, and the eighth off transistor are turned on. The first output signal and the second output signal are coupled to the ground and the second supply voltage is provided to the first cross-coupled node and the fourth cross-coupled node.

According to another embodiment of the invention, when the control signal is at a low logic level and the reverse control signal is at a high logic level, the first N-type transistor, the third N-type transistor, the fifth N-type transistor, and the seventh N-type transistor are turned on and the fifth off transistor, the sixth off transistor, the seventh off transistor, and the eighth off transistor are turned off, so that the first latch circuit and the second latch circuit operate normally.

According to yet another embodiment of the invention, the first latch circuit further comprises a ninth off transistor. The ninth off transistor couples the first cross-coupled node to the ground according to the control signal. The second latch circuit further comprises a tenth off transistor. The tenth off transistor couples the fourth cross-coupled node to the ground according to the control signal.

According to an embodiment of the invention, the circuit further comprises a choke transistor. The choke transistor provides the first supply voltage to the first input inverter and the third input inverter according to the control signal.

According to an embodiment of the invention, when the control signal is at a high logic level and the reverse control signal is at a low logic level, the first N-type transistor, the third N-type transistor, the fifth N-type transistor, and the seventh N-type transistor are turned off, and the ninth off transistor and the tenth off transistor are turned on to couple the first cross-coupled node and the fourth cross-coupled node to the ground.

According to an embodiment of the invention, when the first input signal and the second input signal are at the high logic level, the choke transistor is turned off according to the control signal at the high logic level, and the first reverse input signal and the third reverse input signal are at the low logic level and the second reverse input signal and the fourth reverse input signal are at the high logic level.

According to another embodiment of the invention, when the control signal is at a low logic level and the reverse control signal is at a high logic level, the first N-type transistor, the third N-type transistor, the fifth N-type transistor, the seventh N-type transistor, and the choke transistor are turned on, and the ninth off transistor and the tenth off transistor are turned off, so that the first latch circuit and the second latch circuit operate normally.

According to an embodiment of the invention, the P-type transistors and the N-type transistors are arranged in a second direction. The first direction and the second direction are orthogonal.

According to an embodiment of the invention, the circuit further comprises a ninth N-type transistor, a tenth N-type transistor, an eleven N-type transistor, and a twelfth N-type transistor. The ninth N-type transistor comprises a source terminal, a gate terminal, and a drain terminal. The source terminal and the gate terminal are coupled to the ground. The tenth N-type transistor comprises a source terminal, a gate terminal, and a drain terminal. The source terminal and the gate terminal are coupled to the drain terminal of the ninth N-type transistor, and the drain terminal is coupled to the first input signal. The eleventh N-type transistor comprises a source terminal, a gate terminal, and a drain terminal. The source terminal and the gate terminal are coupled to the ground. The twelfth N-type transistor comprises a source terminal, a gate terminal, and a drain terminal. The source terminal and the gate terminal are coupled to the drain terminal of the eleventh N-type transistor, and the drain terminal is coupled to the second input signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It would be understood that, in the description herein and throughout the claims that follow, although the terms "first," "second," etc. may be used to describe various elements, these elements should not be limited by these terms. These terms are only used to distinguish one element from another. For example, a first element could be termed a second element, and, similarly, a second element could be termed a first element, without departing from the scope of the embodiments.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Figure 1:
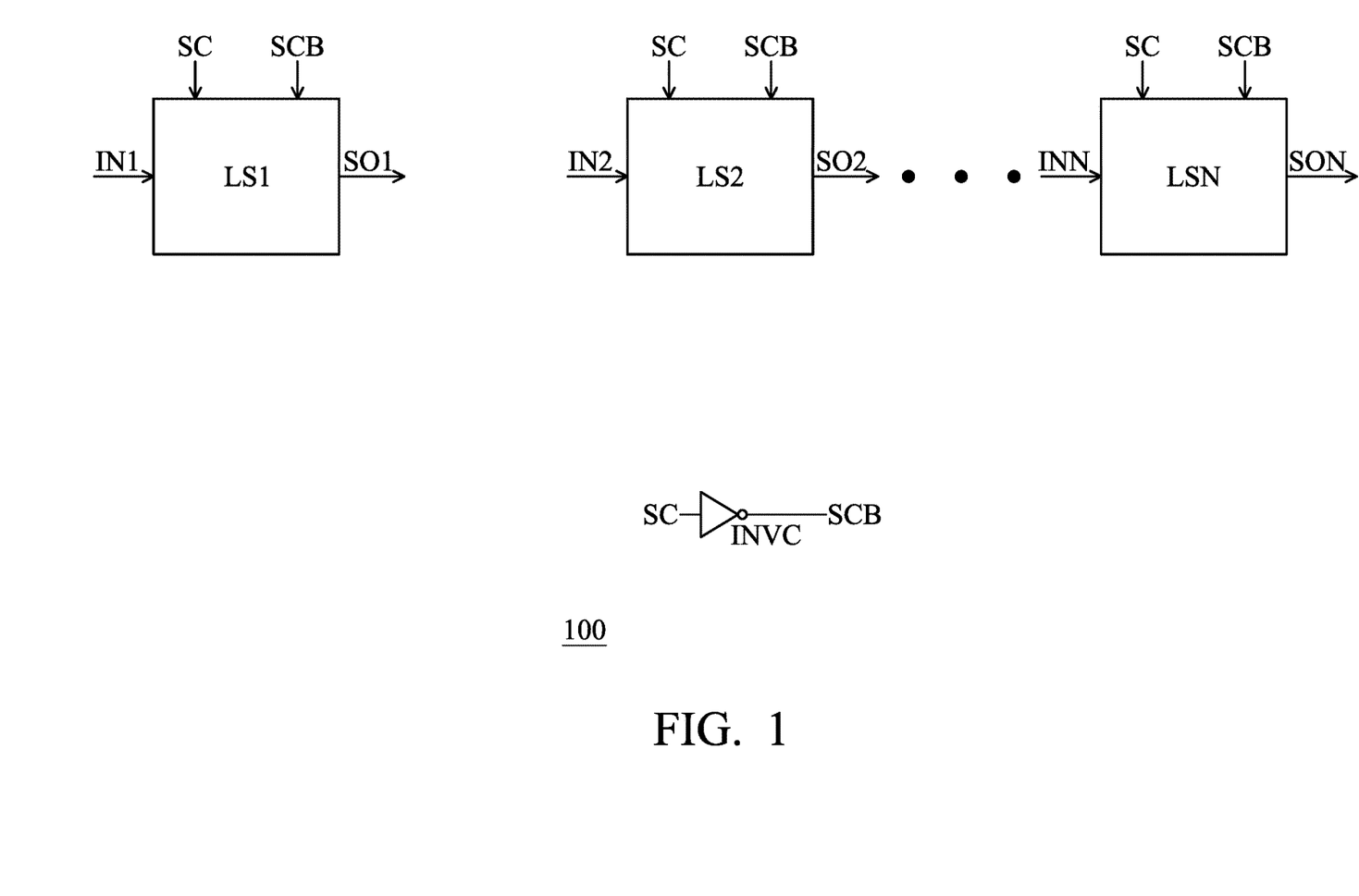
FIG. 1 is a block diagram of a multi-bit level shifter in accordance with an embodiment of the invention.

FIG. 1 is a block diagram of a multi-bit level shifter in accordance with an embodiment of the invention. As shown in FIG. 1, the multi-bit level shifter 100 includes a control inverter INVC, a first level shifter LS1, a second level shifter LS2 . . . , and an N-th level shifter LSN.

The control inverter INVC inverts a control signal SC to generate a reverse control signal SCB. According to an embodiment of the invention, the control signal SC is provided externally. The first level shifter LS1, the second level shifter LS2 . . . , and the N-th level shifter LSN respectively convert the first input signal IN1, the second input signal IN2 . . . , and the N-the input signal INN into the first output signal SO1, the second output signal SO2 . . . , and the N-th output signal SON according to the control signal SC and the reverse control signal SCB.

In other words, the first level shifter LS1, the second level shifter LS2 . . . , and the N-th level shifter LSN share the same set of control signal SC and reverse control signal SCB, instead each level shifter is controlled by an individual set of control signal SC and reverse control signal SCB. Since N level shifters share the same inverter for generating the reverse control signal SCB, (N−1) inverters may be reduced.

Figure 2:
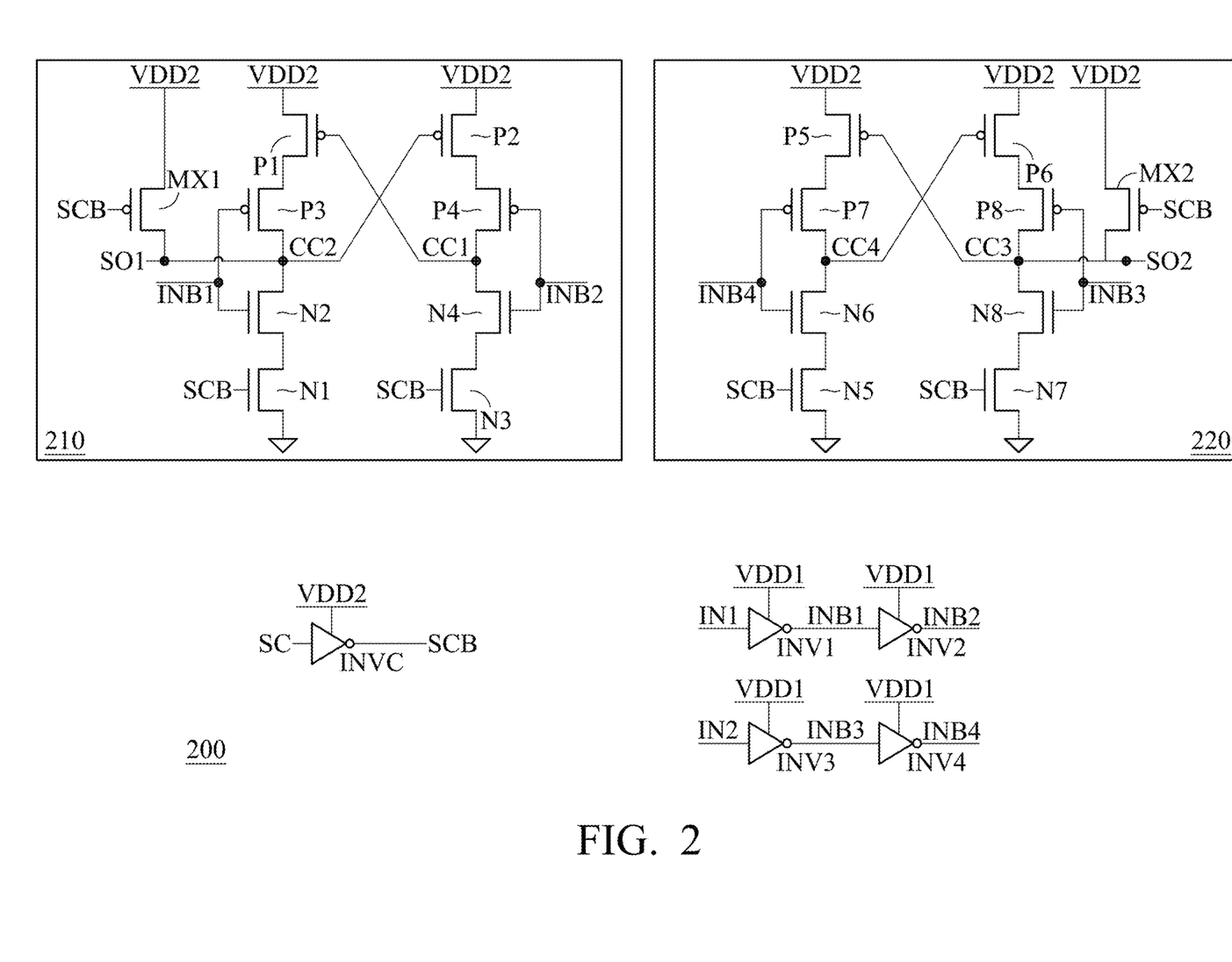
FIG. 2 a schematic diagram of a multi-bit level shifter in accordance with an embodiment of the invention.

FIG. 2 a schematic diagram of a multi-bit level shifter in accordance with an embodiment of the invention. As shown in FIG. 2, the multi-bit level shifter 200 includes a first input inverter INV1, a second input inverter INV2, a third input inverter INV3, a fourth input inverter INV4, a control inverter INVC, a first latch circuit 210, and a second latch circuit 220. A multi-bit level shifter including two latch circuits are merely illustrated in FIG. 2 for explanation, but not intended to be limited thereto. According to other embodiments of the invention, the multi-bit level shifter 200 may include any number of level shifters.

The first input inverter INV1 receives a first input signal IN1 and inverses the first input signal IN1 to generate a first reverse input signal INB1. The second input inverter INV2 receives the first reverse input signal INB1 and inverses the first reverse input signal INB1 to generate a second reverse input signal INB2. The third input inverter INV3 receives a second input signal IN2 and inverses the second input signal IN2 to generate a third reverse input signal INB3. The fourth input inverter INV4 receives the third reverse input signal INB3 and inverses the third reverse input signal INB3 to generate a fourth reverse input signal INB4.

According to an embodiment of the invention, the first reverse input signal INB1 and the first input signal IN1 are out-phase, the second reverse input signal INB2 and the first input signal IN1 are in-phase, the third reverse input signal INB3 and the second input signal IN2 are out-phase, and the fourth reverse input signal INB4 and the second input signal IN2 are in-phase. As illustrated in FIG. 2, the first input inverter INV1, the second input inverter INV2, the third input inverter INV3, and the fourth input inverter INV4 are supplied by a first supply voltage VDD1. The control inverter INVC receives a control signal SC and inverses the control signal SC to generate a reverse control signal SCB.

The first latch circuit 210 includes a first P-type transistor P1, a second P-type transistor P2, a third P-type transistor P3, a fourth P-type transistor P4, a first N-type transistor N1, a second N-type transistor N2, a third N-type transistor N3, a fourth N-type transistor N4, and a first off transistor MX1.

The first P-type transistor P1 includes a control terminal, a first terminal, and a second terminal. The control terminal is coupled to the first cross-coupled node CC1 and the first terminal is coupled to the second supply voltage VDD2. The second P-type transistor P2 includes a control terminal, a first terminal, and a second terminal. The control terminal is coupled to a second cross-coupled node CC2 and the first terminal is coupled to the second supply voltage VDD2. According to an embodiment of the invention, the first supply voltage VDD1 and the second supply voltage VDD2 are different.

The third P-type transistor P3 includes a control terminal, a first terminal, and a second terminal. The control terminal receives the first reverse input signal INB1, the first terminal is coupled to the second terminal of the first P-type transistor P1, and the second terminal is coupled to the second cross-coupled node CC2. The first output signal SO1 is generated at the second cross-coupled node CC2. The fourth P-type transistor P4 includes a control terminal, a first terminal, and a second terminal. The control terminal receives the second reverse input signal INB2, the first terminal is coupled to the second terminal of the second P-type transistor P2, and the second terminal is coupled to the first cross-coupled node CCT.

The first N-type transistor N1 includes a control terminal, a first terminal, and a second terminal. The control terminal receives the reverse control signal SCB and the first terminal is coupled to the ground. The second N-type transistor N2 includes a control terminal, a first terminal, and a second terminal. The control terminal receives the first reverse input signal INB1, the first terminal is coupled to the second terminal of the first N-type transistor N1, and the second terminal is coupled to the second cross-coupled node CC2.

The third N-type transistor N3 includes a control terminal, a first terminal, and a second terminal. The control terminal receives the reverse control signal SCB and the first terminal is coupled to the ground. The fourth N-type transistor N4 includes a control terminal, a first terminal, and a second terminal. The control terminal receives the second reverse input signal INB2, the first terminal is coupled to the second terminal of the third N-type transistor N3, and the second terminal is coupled to the first cross-coupled node CC1. The first off transistor MX1 provides the second supply voltage VDD2 to the second cross-coupled node CC2 according to the reverse control signal SCB.

The second latch circuit 220 includes a fifth P-type transistor P5, a sixth P-type transistor P6, a seventh P-type transistor P7, an eighth P-type transistor P8, a fifth N-type transistor N5, a sixth N-type transistor N6, a seventh N-type transistor N7, an eighth N-type transistor N8, and a second off transistor MX2.

The fifth P-type transistor P5 includes a control terminal, a first terminal, and a second terminal. The control terminal is coupled to the third cross-coupled node CC3, the first terminal is coupled to the second supply voltage VDD2. The sixth P-type transistor P6 includes a control terminal, a first terminal, and a second terminal. The control terminal is coupled to a fourth cross-coupled node CC4, the first terminal is coupled to the second supply voltage VDD2.

The seventh P-type transistor P7 includes a control terminal, a first terminal, and a second terminal. The control terminal receives the third reverse input signal INB3, the first terminal is coupled to the second terminal of the fifth P-type transistor P5, and the second terminal is coupled to the fourth cross-coupled node CC4. The eighth P-type transistor P8 includes a control terminal, a first terminal, and a second terminal. The control terminal receives the fourth reverse input signal INB4, the first terminal is coupled to the second terminal of the sixth P-type transistor P4, and the second terminal is coupled to the third cross-coupled node CC3. The second output signal SO2 is generated at the third cross-coupled node CC3.

The fifth N-type transistor N5 includes a control terminal, a first terminal, and a second terminal. The control terminal receives the reverse control signal SCB and the first terminal is coupled to the ground. The sixth N-type transistor N6 includes a control terminal, a first terminal, and a second terminal. The control terminal receives the third reverse input signal INB3, the first terminal is coupled to the second terminal of the fifth N-type transistor N5, and the second terminal is coupled to the fourth cross-coupled node CC4.

The seventh N-type transistor N7 includes a control terminal, a first terminal, and a second terminal. The control terminal receives the reverse control signal SCB and the first terminal is coupled to the ground. The eighth N-type transistor N8 includes a control terminal, a first terminal, and a second terminal. The control terminal receives the fourth reverse input signal INB4, the first terminal is coupled to the second terminal of the seventh N-type transistor N7, and the second terminal is coupled to the third cross-coupled node CC3. The second off transistor MX2 provides the second supply voltage VDD2 to the third cross-coupled node CC3 according to the reverse control signal SCB.

According to an embodiment of the invention, the first latch circuit 210 and the second latch circuit 220 are activated by the control signal SC and the reverse control signal SCB. More specifically, when the control signal SC is at the high logic level and the reverse control signal SCB is at the low logic level, the first N-type transistor N1, the third N-type transistor N3, the fifth N-type transistor N5, and the seventh N-type transistor N7 are turned off to deactivate the first latch circuit 210 and the second latch circuit 220, and the first off transistor MX1 and the second off transistor MX2 are turned on respectively to pull the first output signal SO1 and the second output signal SO2 to the second supply voltage VDD2.

In addition, when the control signal SC is at the low logic level and the reverse control signal SCB is at the high logic level, the first N-type transistor N1, the third N-type transistor N3, the fifth N-type transistor N5, and the seventh N-type transistor N7 are turned on, and the first off transistor MX1 and the second off transistor MX2 are turned off, so that the first latch circuit 210 and the second latch circuit 220 are activated.

Accordingly, the first latch circuit 210 converts the first reverse input signal INB1 and the second reverse input signal INB2 (i.e., the first input signal IN1) ranging from the first supply voltage VDD1 to the ground into the first output signal SO1 ranging from the second supply voltage VDD2 to the ground, and the second latch circuit 220 converts the third reverse input signal INB3 and the fourth reverse input signal INB4 (i.e., the second input signal IN2) ranging from the first supply voltage VDD1 to the ground into the second output signal SO2 ranging from the second supply voltage VDD2 to the ground.

Figure 3:
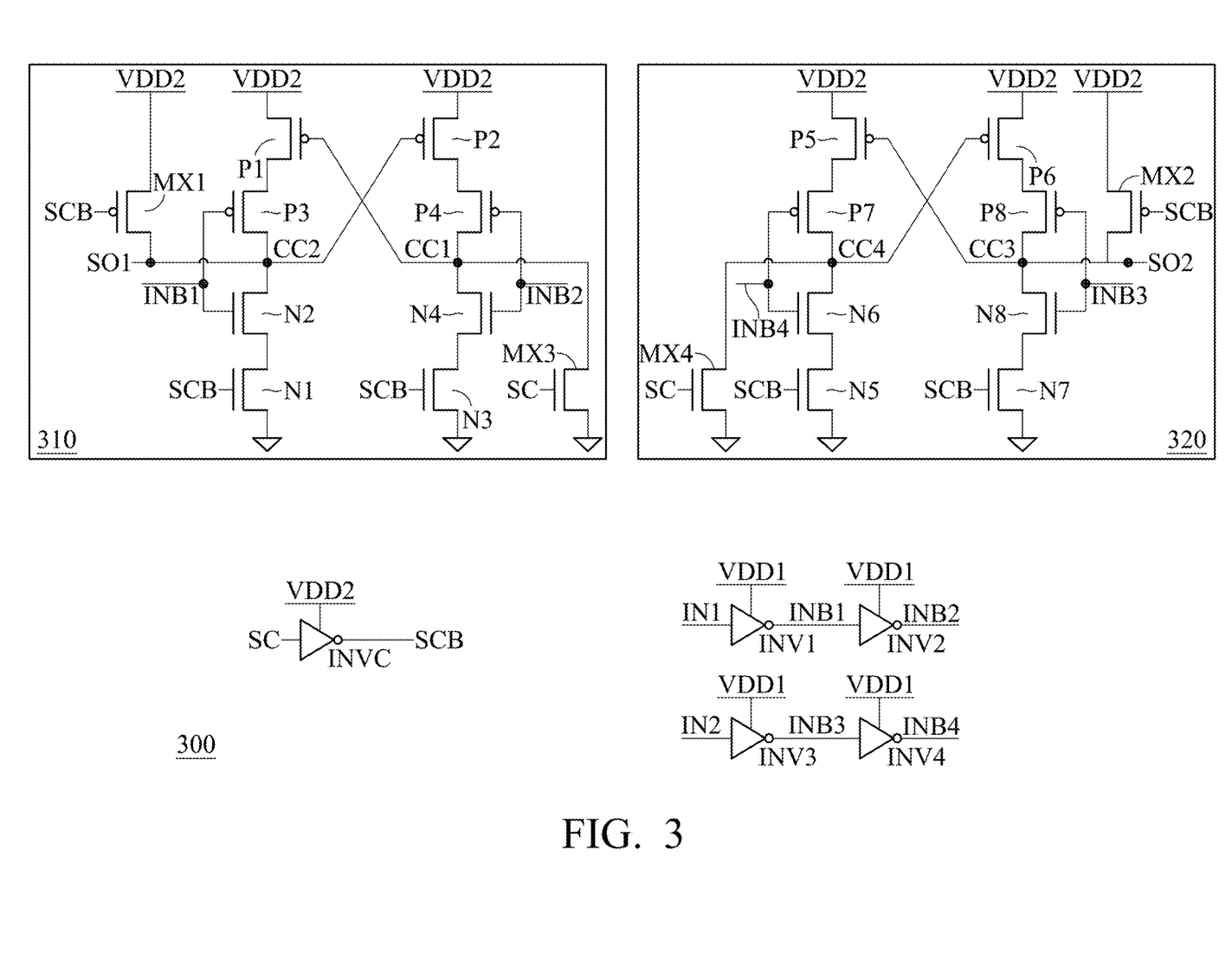
FIG. 3 is a schematic diagram of a multi-bit level shifter in accordance with another embodiment of the invention.

FIG. 3 is a schematic diagram of a multi-bit level shifter in accordance with another embodiment of the invention. Comparing the multi-bit level shifter 300 in FIG. 3 with the multi-bit level shifter 200 in FIG. 2, the first latch circuit 310 further includes a third off transistor MX3, and the second latch circuit 320 further includes a fourth transistor MX4. The third off transistor MX3 couples the first cross-coupled node CC1 to the ground according to the control signal SC. The fourth off transistor MX4 couples the fourth cross-coupled node CC4 to the ground according to the control signal SC.

According to an embodiment of the invention, when the control signal SC is at the high logic level and the reverse control signal SCB is at the low logic level, the first N-type transistor N1, the third N-type transistor N3, the fifth N-type transistor N5, and the seventh N-type transistor N7 are turned off to deactivate the first latch circuit 310 and the second latch circuit 320. In addition, the first off transistor MX1 and the second off transistor MX2 are turned on respectively to pull the first output signal SO1 and the second output signal SO2 up to the second supply voltage VDD2, and the third off transistor MX3 and the fourth off transistor MX4 are turned on to respectively couple the first cross-coupled node CC1 and the fourth cross-coupled node CC4 to the ground.

According to another embodiment of the invention, when the control signal SC is at the low logic level and the reverse control signal SCB is at the high logic level, the first latch circuit 310 and the second latch circuit 320 operate as the first latch circuit 210 and the second latch circuit 220 do, which is not repeated herein.

Figure 4:
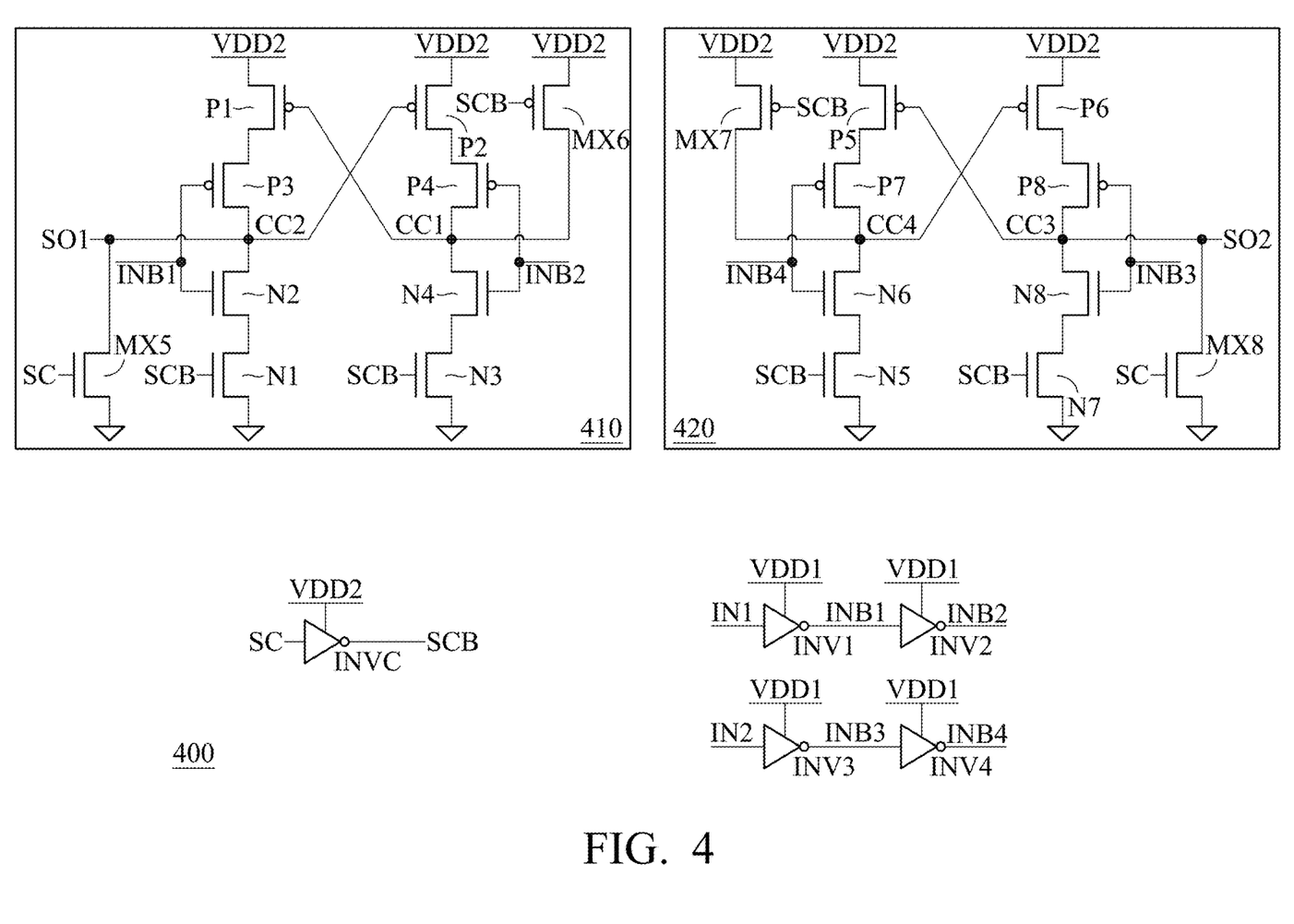
FIG. 4 is a schematic diagram of a multi-bit level shifter in accordance with yet another embodiment of the invention.

FIG. 4 is a schematic diagram of a multi-bit level shifter in accordance with yet another embodiment of the invention. Comparing the multi-bit level shifter 400 with the multi-bit level shifter 300 in FIG. 3, the first off transistor MX1 and the second off transistor MX2 in the first latch circuit 310 are replaced with a fifth off transistor MX5 and a sixth off transistor MX6 in the first latch circuit 410, and the third off transistor MX3 and the fourth off transistor MX4 are replaced with a seventh off transistor MX7 and an eighth off transistor MX8 in the second latch circuit 420.

The fifth off transistor MX5 couples the first output signal SO1 to the ground according to the control signal SC. The sixth off transistor MX6 provides the second supply voltage VDD2 to the first cross-coupled node CC1 according to the reverse control signal SCB. The seventh off transistor MX7 provides the second supply voltage VDD2 to the fourth cross-coupled node CC4 according to the reverse control signal SCB. The eighth off transistor MX8 couples the second output signal SO2 to the ground according to the control signal SC.

According to an embodiment of the invention, when the control signal SC is at the high logic level and the reverse control signal SCB is at the low logic level, the first N-type transistor N1, the third N-type transistor N3, the fifth N-type transistor N5, and the seventh N-type transistor N7 are turned off to deactivate the first latch circuit 410 and the second latch circuit 420, the fifth off transistor MX5 and the eighth off transistor MX8 are turned on to pull the first output signal SO1 and the second output signal SO2 down to the ground, and the sixth off transistor MX6 and the seventh off transistor MX7 are turned on to provide the second supply voltage VDD2 to the first cross-coupled node CC1 and the fourth cross-coupled node CC4.

According to another embodiment of the invention, when the control signal SC is at the low logic level and the reverse control signal SCB is at a high logic level, the first N-type transistor N1, the third N-type transistor N3, the fifth N-type transistor N5, and the seventh N-type transistor N7 are turned on, and the fifth off transistor MX5, the sixth off transistor MX6, the seventh off transistor MX7, and the eighth off transistor MX8 are turned off, so that the first latch circuit 410 and the second latch circuit 420 operate normally.

Figure 5:
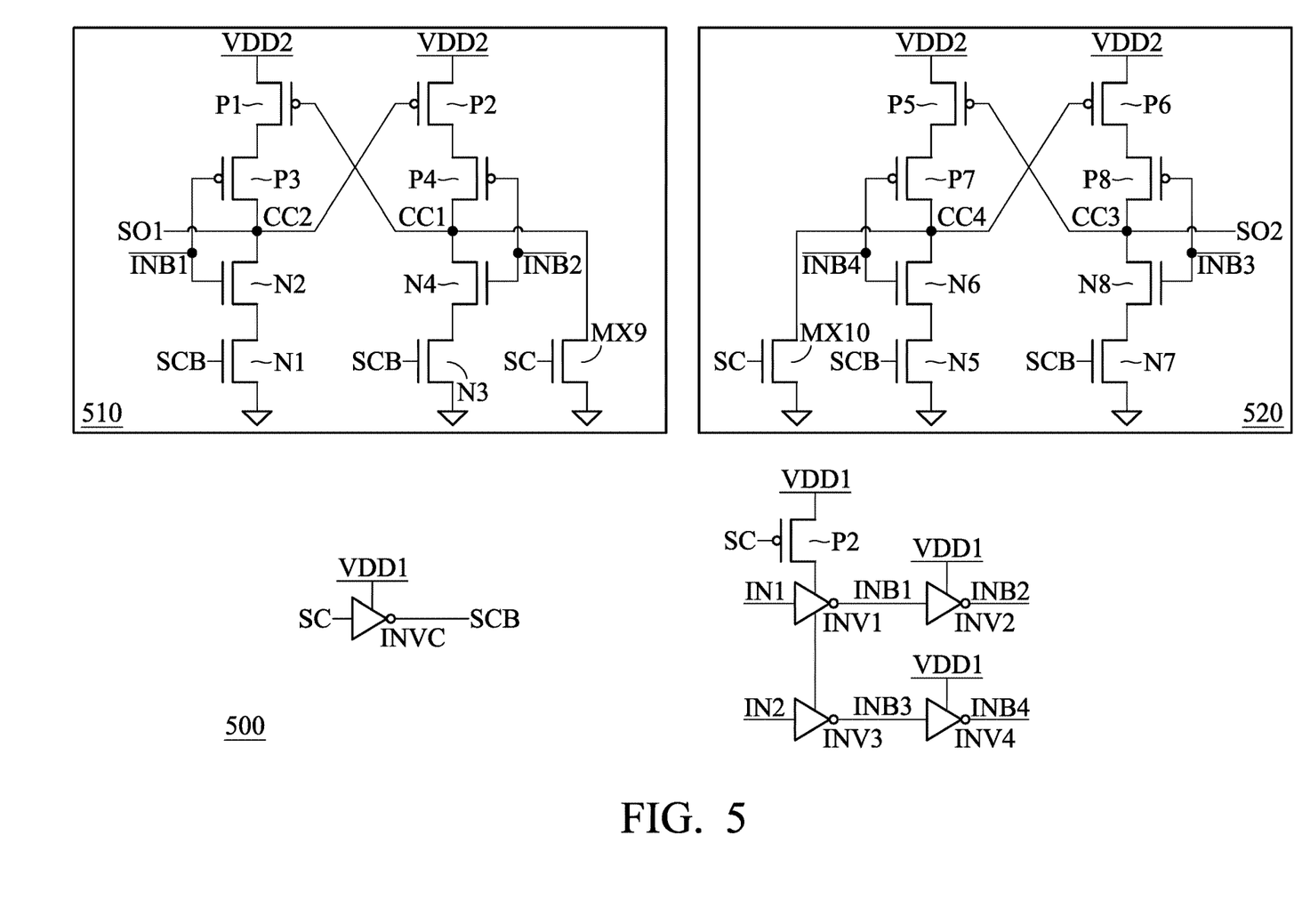
FIG. 5 is a schematic diagram of a multi-bit level shifter in accordance with yet another embodiment of the invention.

FIG. 5 is a schematic diagram of a multi-bit level shifter in accordance with yet another embodiment of the invention. Comparing the multi-bit level shifter 500 with the multi-bit level shifter 400 in FIG. 4, the fifth off transistor MX5 and the sixth off transistor MX6 in the first latch circuit 410 are replaced with a ninth off transistor MX9 in the first latch circuit 510, and the seventh off transistor MX7 and the eighth off transistor MX8 in the second latch circuit 420 are replaced with a tenth off transistor MX10 in the second latch circuit 520. In addition, the multi-bit level shifter 500 further includes a choke transistor MC.

The ninth off transistor MX9 couples the first cross-coupled node CCT to the ground according to the control signal SC. The tenth off transistor MX10 couples the fourth cross-coupled node CC4 to the ground according to the control signal SC. The choke transistor MC supplies the first supply voltage VDD1 to the first input inverter INV1 and the third input inverter INV3 according to the control signal SC.

According to an embodiment of the invention, when the control signal SC is at the high logic level and the reverse control signal SCB is at the low logic level, the first N-type transistor N1, the third N-type transistor N3, the fifth N-type transistor N5, and the seventh N-type transistor N7 are turned off to deactivate the first latch circuit 510 and the second latch circuit 520, and the ninth off transistor MX9 and the tenth off transistor MX10 are turned on to couple the first cross-coupled node CC1 and the fourth cross-coupled node CC4 to the ground.

In addition, when the first input signal IN1 and the second input signal IN2 are also at the high logic level, the choke transistor MC is turned off according to the control signal SC at the high logic level, the first reverse input signal INB1 and the third reverse input signal INB3 are at the low logic level, and the second reverse input signal INB2 and the fourth reverse input signal INB4 are at the high logic level.

According to another embodiment of the invention, when the control signal SC is at the low logic level and the reverse control signal SCB is at a high logic level, the first N-type transistor N1, the third N-type transistor N3, the fifth N-type transistor N5, the seventh N-type transistor N7, and the choke transistor MC are turned on, and the ninth off transistor MX9 and the tenth off transistor MX10 are turned off, so that the first latch circuit 510 and the second latch circuit 520 operate normally.

Figure 6:
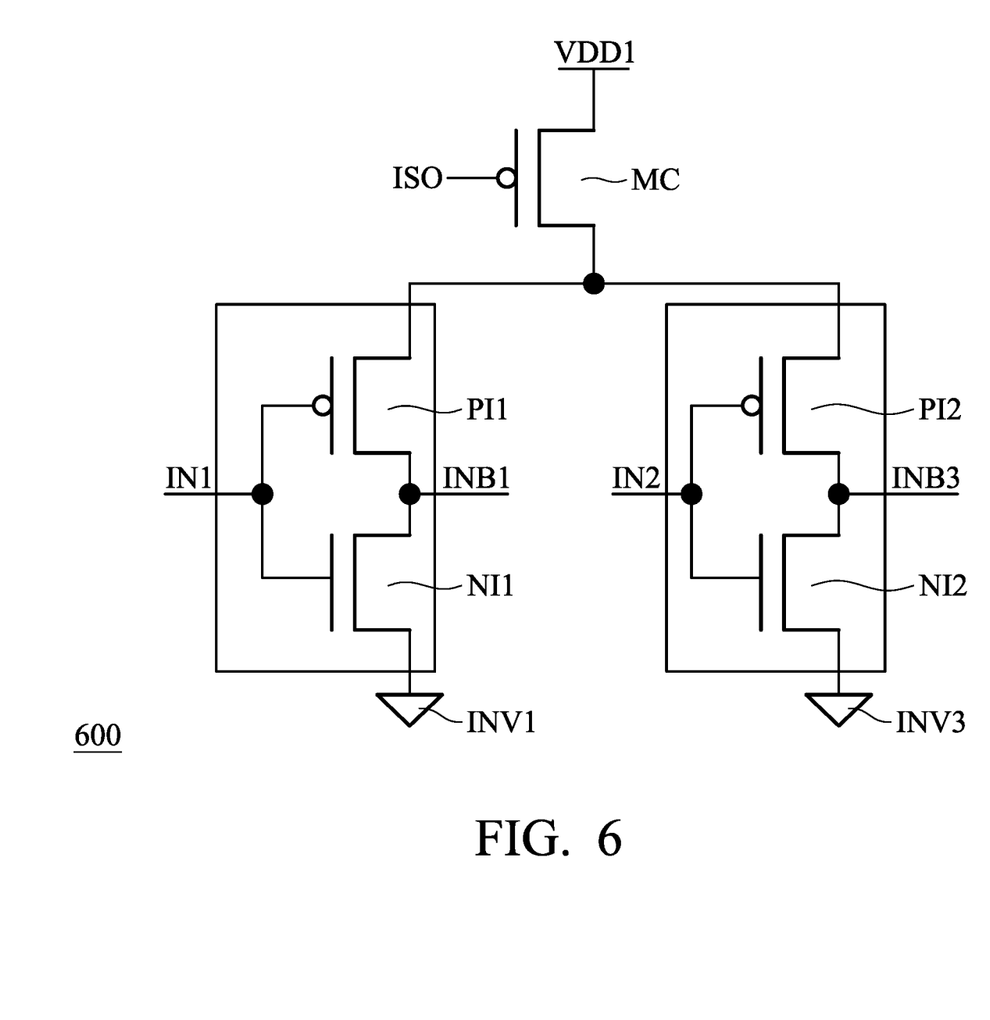
FIG. 6 is a schematic diagram of the choke transistor, the first input inverter, and the third inverter in FIG. 5 in accordance with an embodiment of the invention.

FIG. 6 is a schematic diagram of the choke transistor, the first input inverter, and the third inverter in FIG. 5 in accordance with an embodiment of the invention. As shown in FIG. 6, the first input inverter INV1 includes a first P-type inverter transistor PIT and a first N-type inverter transistor NIT. The third input inverter INV3 includes a second P-type inverter transistor PI2 and a second N-type inverter transistor NI2.

The first P-type inverter transistor PIT provides the first supply voltage VDD1 from the choke transistor MC to the first reverse input signal INB1 according to the first input signal IN1. The first N-type inverter transistor NIT couples the first reverse input signal INB1 to the ground according to the first input signal IN1. The second P-type inverter transistor PI2 provides the first supply voltage VDD1 from the choke transistor MC to the first reverse input signal INB1 according to the second input signal IN2. The second N-type inverter transistor NI2 couples the third reverse input signal INB3 to the ground according to the second input signal IN2.

As shown in FIG. 6, when the control signal SC, the first input signal IN1, and the second input signal IN2 are at the high logic level, the choke transistor MC is turned off according to the control signal SC at the high logic level, and the first P-type inverter transistor PIT and the second P-type inverter transistor PI2 are turned off according to the first input signal IN1 and the second input signal IN2 at the high logic level. The first N-type inverter transistor NIT and the second N-type inverter transistor NI2 are turned on so that the first reverse input signal INB1 and the third reverse input signal INB3 are pulled down to the ground.

Figure 7A:
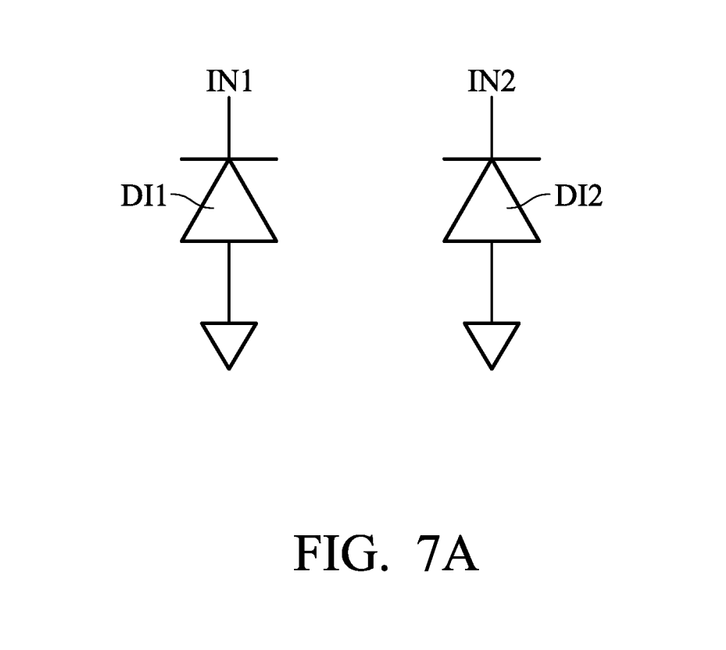
FIGS. 7A-7B illustrate methods to eliminate antenna effect in accordance with some embodiments of the invention.
Figure 7B:
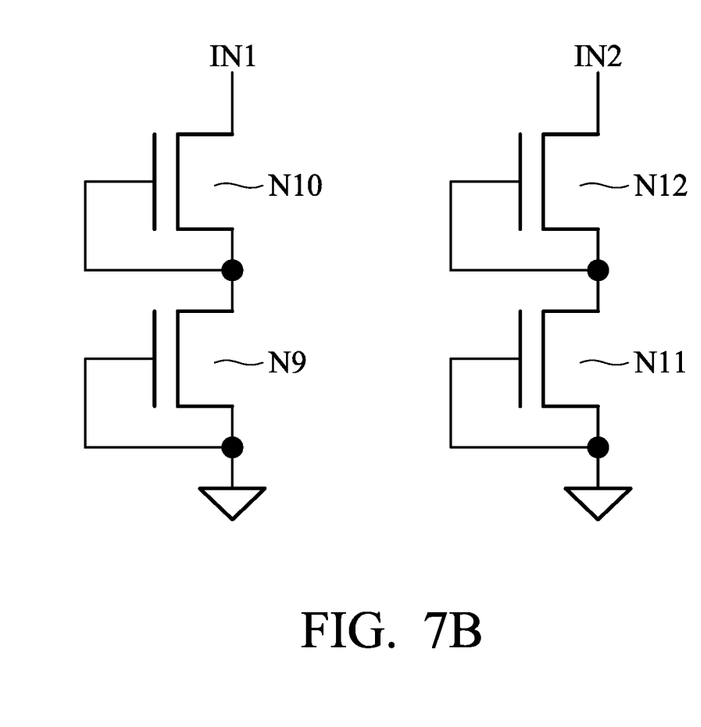

FIGS. 7A-7B illustrate methods to eliminate antenna effect in accordance with some embodiments of the invention. As shown in FIG. 7A, the first input signal IN1 is coupled to the ground through a first reverse-biased diode D1*l*, and the second input signal IN2 is coupled to the ground through a second reverse-biased diode D12. Therefore, charge accumulated on the first input signal IN1 or the second input signal IN2 may respectively be discharged to the ground through the first diode D1*l* or the second diode D12. However, the chip area of the first diode D1*l* and the second diode D12 are significant.

As shown in FIG. 7B, the first input signal IN1 is coupled to the ground through a ninth N-type transistor N9 and a tenth N-type transistor N10, and the second input signal IN2 is coupled to the ground through an eleventh N-type transistor N11 and a twelfth N-type transistor N12.

The ninth N-type transistor N9 includes a source terminal, a gate terminal, and a drain terminal. The source terminal and the gate terminal are coupled to the ground. The tenth N-type transistor N10 includes a source terminal, a gate terminal, and a drain terminal. The source terminal and the gate terminal are coupled to the drain terminal of the ninth N-type transistor N9, and the drain terminal is coupled to the first input signal NIT.

The eleventh N-type transistor N11 includes a source terminal, a gate terminal, and a drain terminal. The source terminal and the gate terminal are coupled to the ground. The twelfth N-type transistor N12 includes a source terminal, a gate terminal, and a drain terminal. The source terminal and the gate terminal are coupled to the drain terminal of the eleventh N-type transistor N11, and the drain terminal is coupled to the second input signal IN2.

According to an embodiment of the invention, when charge is accumulated on the first input signal IN1 or the second input signal IN2, the accumulated charge may be discharged to the ground through the ninth N-type transistor N9 and the tenth N-type transistor N10 or the eleventh N-type transistor N11 and the twelfth N-type transistor N12. However, the chip area of the ninth N-type transistor N9 and the tenth N-type transistor N10 (or the eleventh N-type transistor N11 and the twelfth N-type transistor N12) is much smaller than that of first diode D1*l* (or the second diode D12), so that the chip area may be significantly reduced.

Figure 8:
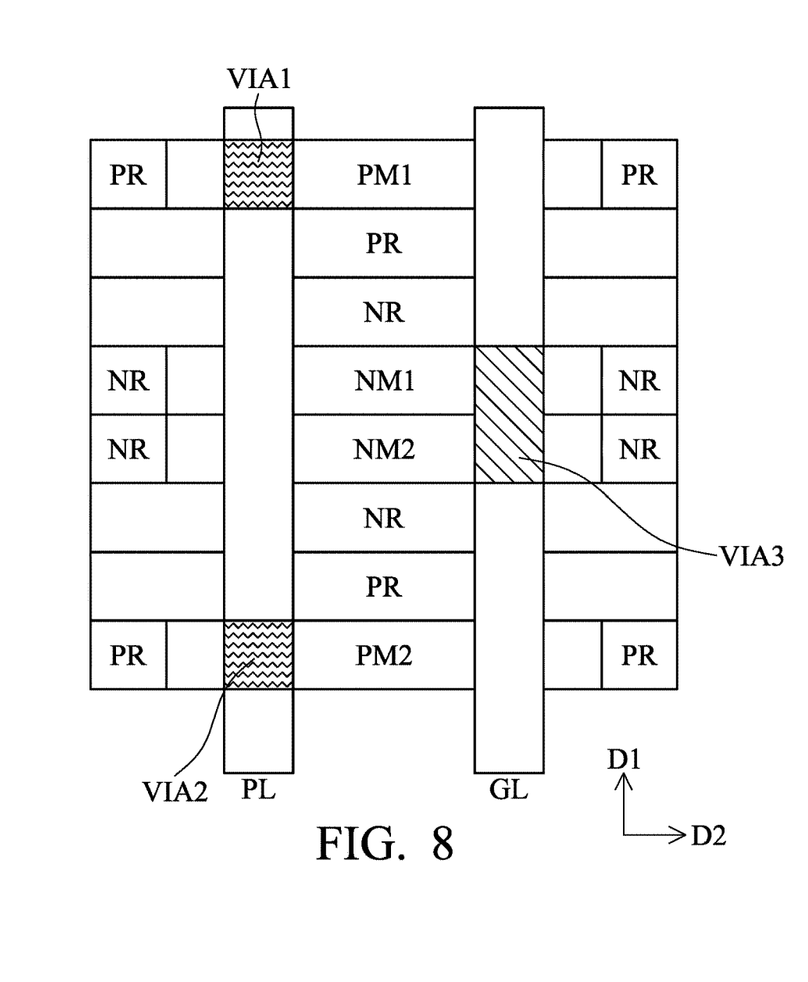
FIG. 8 illustrates a layout of the multi-bit level shifter in accordance with an embodiment of the invention.

FIG. 8 illustrates a layout of the multi-bit level shifter in accordance with an embodiment of the invention. As shown in FIG. 8, a layout 800 includes a first P-type transistor layout PM1, a second P-type transistor layout PM2, a first N-type transistor layout NM1, and a second N-type transistor layout NM2, where a first N-type transistor layout NM1 and a second N-type transistor layout NM2 are surrounded by an N-type guard ring NR. According to an embodiment of the invention, there is another layout 800 arranged with the layout 800 as shown in FIG. 8, so that the first P-type transistor layout PM1 and the second P-type transistor layout PM2 are surrounded by a P-type guard ring PR. As shown in the embodiment of FIG. 8, the first P-type transistor layout PM1, the P-type guard ring PR, the N-type guard ring NR, the first N-type transistor layout NM1, the second N-type transistor layout NM2, and the second N-type transistor layout PM2 are arranged along the first direction D1.

According to some embodiments of the invention, each transistor of the multi-bit level shifters 200~600 in FIGS. 2-6 may be arranged in the manner as the layout 800 does. As shown in FIG. 8, the layout 800 further includes a power line PL and a ground line GL.

The power line PL includes a first via landing region VIA1 and a second via landing region VIA2, where the first via landing region VIA1 and the second via landing region VIA2 are configured to provide the supply voltage provided by the power line PL to the first P-type transistor layout PM1 and the second P-type transistor layout PM2.

The ground line GL includes a third via landing region VIA3, where the third via landing region VIA3 is configured to couple the first N-type transistor layout NMT and the second N-type transistor layout NM2 to the ground. According to an embodiment of the invention, the power line PL and the ground line GL may be formed by the same metal layer or different metal layers, and the first via landing region VIA1, the second via landing region VIA2, and the third via landing region VIA3 may be formed by the same or different via layers.

Figure 9:
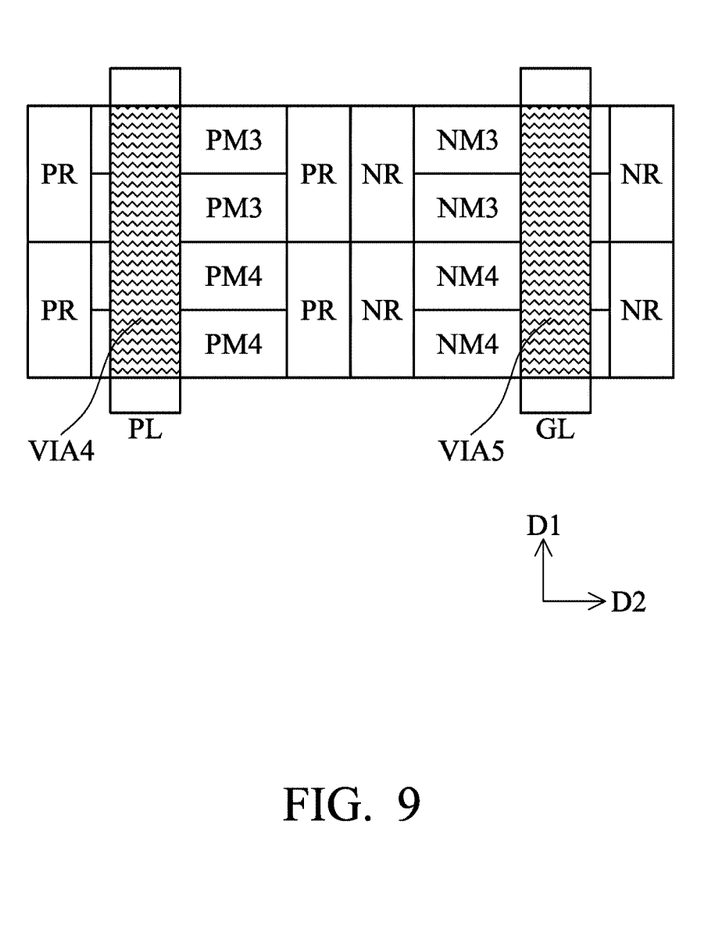
FIG. 9 illustrates a layout of the multi-bit level shifter in accordance with another embodiment of the invention.

FIG. 9 illustrates a layout of the multi-bit level shifter in accordance with another embodiment of the invention.

As shown in FIG. 9, the P-type transistor layouts PM3 and PM4 and the N-type transistor layouts NM3 and NM4 are further arranged in a second direction D2, where the first direction D1 and the second direction D2 are orthogonal. According to an embodiment of the invention, the first direction D1 is Y-axis and the second direction D2 is X-axis. In addition, the P-type guard ring PR and the N-type guard ring NR are also surrounded the third P-type transistor layout PM3, the fourth P-type transistor layout PM4, the third N-type transistor layout NM3, and the fourth N-type transistor layout NM4.

As shown in FIG. 9, the power line PL goes across the third P-type transistor layout PM3 and the fourth P-type transistor layout PM4 and provides the supply voltage to the third P-type transistor layout PM3 and the fourth P-type transistor layout PM4 through the fourth via landing region VIA4. The ground line GL goes across the third N-type transistor layout NM3 and the fourth N-type transistor layout NM4 and couples the third N-type transistor layout NM3 and the fourth N-type transistor layout NM4 to the ground through the fifth via landing region VIA5.

Comparing the layout 900 to the layout 800 in FIG. 8, the P-type guard ring PR, the P-type transistors (including the third P-type transistor layout PM3 and the fourth P-type transistor layout PM4), the P-type guard ring PR, the N-type guard ring NR, the N-type transistors (including the third N-type transistor layout NM3 and the fourth N-type transistor layout NM4), and the N-type guard ring NR are arranged in the second direction D2, so that the power line PL or the ground line GL can have 2 times of via landing region than that of the layout 800, with half height in the first direction D1 of the layout 800.

In other words, since the P-type guard ring PR and the N-type guard ring NR of the layout 900 are arranged in the second direction D2 to separate P-type transistors and N-type transistors apart in the second direction D2, the via landing region of the layout 900 can be doubled, compared to that of the layout 800.

In addition, since the layout 900 separates the P-type transistor layout and the N-type transistor layout apart, the overall area of the layout 900 may be significantly reduced, compared to that of the layout 800 in FIG. 8.

Many architectures of a multi-bit level shifter are provided herein. Since all N latch circuits share the same control inverter for generating the reverse control signal, (N−1) inverters or (N−1)*2 transistors are reduced, which may be a significant reduction when N is a significant number. The output signals of the multi-bit level shifter may be pulled to the supply voltage or the ground for preventing the output signals from floating. The invention also provides a space-saving way to eliminate the antenna effect, as well as an area-efficient layout for the multi-bit level shifter to not only improve ESD performance but also reduce the overall chip area.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit, comprising:
   a control inverter, receiving a control signal to generate a reverse control signal, wherein the reverse control signal is an inverse of the control signal;
   a first latch circuit, activated by the reverse control signal to convert a first input signal ranging from a first supply voltage to a ground into a first output signal ranging from a second supply voltage to the ground; and
   a second latch circuit, activated by the reverse control signal to convert a second input signal ranging from the first supply voltage to the ground into a second output signal ranging from the second supply voltage to the ground, wherein the first supply voltage and the second supply voltage are different;
   wherein the first latch circuit comprises a plurality of P-type transistors and a plurality of N-type transistors;
   wherein the P-type transistors are arranged in a first direction, the N-type transistors are arranged in the first direction, and the P-type transistors and the N-type transistors are arranged in a second direction;
   wherein the first direction and the second direction are orthogonal,
   wherein a P-type guard ring surrounds the P-type transistors;
   wherein an N-type guard ring surrounds the N-type transistors;
   wherein the P-type guard ring and the N-type guard ring are arranged in the second direction and adjacent to each other.

2. The circuit as defined in claim 1, further comprising:
   a first input inverter, receiving the first input signal to generate a first reverse input signal;
   a second input inverter, receiving the first reverse input signal to generate a second reverse input signal;
   a third input inverter, receiving the second input signal to generate a third reverse input signal; and
   a fourth input inverter, receiving the third reverse input signal to generate a fourth reverse input signal, wherein the first input inverter, the second input inverter, the third input inverter, and the fourth input inverter are supplied by the first supply voltage.

3. The circuit as defined in claim 2, wherein the first latch circuit comprises:
   a first P-type transistor, comprising a control terminal, a first terminal, and a second terminal, wherein the control terminal is coupled to a first cross-coupled node, and the first terminal is coupled to the second supply voltage;
   a second P-type transistor, comprising a control terminal, a first terminal, and a second terminal, wherein the control terminal is coupled to a second cross-coupled node, and the first terminal is coupled to the second supply voltage;
   a third P-type transistor, comprising a control terminal, a first terminal, and a second terminal, wherein the control terminal receives the first reverse input signal, the first terminal is coupled to the second terminal of the first P-type transistor, and the second terminal is coupled to the second cross-coupled node, wherein the first output signal is generated at the second cross-coupled node;
   a fourth P-type transistor, comprising a control terminal, a first terminal, and a second terminal, wherein the control terminal receives the second reverse input signal, the first terminal is coupled to the second terminal of the second P-type transistor, and the second terminal is coupled to the first cross-coupled node;
   a first N-type transistor, comprising a control terminal, a first terminal, and a second terminal, wherein the control terminal receives the reverse control signal, and the first terminal is coupled to the ground;
   a second N-type transistor, comprising a control terminal, a first terminal, and a second terminal, wherein the control terminal receives the first reverse input signal, the first terminal is coupled to the second terminal of the first N-type transistor, and the second terminal is coupled to the second cross-coupled node;

a third N-type transistor, comprising a control terminal, a first terminal, and a second terminal, wherein the control terminal receives the reverse control signal, and the first terminal is coupled to the ground; and a fourth N-type transistor, comprising a control terminal, a first terminal, and a second terminal, wherein the control terminal receives the second reverse input signal, the first terminal is coupled to the second terminal of the third N-type transistor, and the second terminal is coupled to the first cross-coupled node.

4. The circuit as defined in claim 3, wherein the second latch circuit comprises:

a fifth P-type transistor, comprising a control terminal, a first terminal, and a second terminal, wherein the control terminal is coupled to a third cross-coupled node, and the first terminal is coupled to the second supply voltage;

a sixth P-type transistor, comprising a control terminal, a first terminal, and a second terminal, wherein the control terminal is coupled to a fourth cross-coupled node, and the first terminal is coupled to the second supply voltage;

a seventh P-type transistor, comprising a control terminal, a first terminal, and a second terminal, wherein the control terminal receives the fourth reverse input signal, the first terminal is coupled to the second terminal of the fifth P-type transistor, and the second terminal is coupled to the fourth cross-coupled node;

an eighth P-type transistor, comprising a control terminal, a first terminal, and a second terminal, wherein the control terminal receives the third reverse input signal, the first terminal is coupled to the second terminal of the sixth P-type transistor, and the second terminal is coupled to the third cross-coupled node, wherein the second output signal is generated at the third cross-coupled node;

a fifth N-type transistor, comprising a control terminal, a first terminal, and a second terminal, wherein the control terminal receives the reverse control signal, and the first terminal is coupled to the ground;

a sixth N-type transistor, comprising a control terminal, a first terminal, and a second terminal, wherein the control terminal receives the fourth reverse input signal, the first terminal is coupled to the second terminal of the fifth N-type transistor, and the second terminal is coupled to the fourth cross-coupled node;

a seventh N-type transistor, comprising a control terminal, a first terminal, and a second terminal, wherein the control terminal receives the reverse control signal, and the first terminal is coupled to the ground; and an eighth N-type transistor, comprising a control terminal, a first terminal, and a second terminal, wherein the control terminal receives the third reverse input signal, the first terminal is coupled to the second terminal of the seventh N-type transistor, and the second terminal is coupled to the third cross-coupled node.

5. The circuit as defined in claim 4, wherein the first latch circuit further comprises:

a first off transistor, providing the second supply voltage to the second cross-coupled node according to the reverse control signal;

wherein the second latch circuit further comprises:

a second off transistor, providing the second supply voltage to the third cross-coupled node according to the reverse control signal.

6. The circuit as defined in claim 5, wherein when the control signal is at a high logic level and the reverse control signal is at a low logic level, the first N-type transistor, the third N-type transistor, the fifth N-type transistor, and the seventh N-type transistor are turned off, and the first off transistor and the second off transistor are turned on to respectively provide the second supply voltage to the first output signal and the second output signal, wherein when the control signal is at a low logic level and the reverse control signal is at a high logic level, the first N-type transistor, the third N-type transistor, the fifth N-type transistor, and the seventh N-type transistor are turned on and the first off transistor and the second off transistor are turned off, so that the first latch circuit and the second latch circuit operate normally.

7. The circuit as defined in claim 4, wherein the first latch circuit further comprises:

a third off transistor, coupling the first cross-coupled node to the ground according to the control signal;

wherein the second latch circuit further comprises:

a fourth off transistor, coupling the fourth cross-coupled node to the ground according to the control signal.

8. The circuit as defined in claim 7, wherein when the control signal is at a high logic level and the reverse control signal is at a low logic level, the first N-type transistor, the third N-type transistor, the fifth N-type transistor, and the seventh N-type transistor are turned off, and the first off transistor, the second off transistor, the third off transistor, and the fourth off transistor are turned on, wherein the second supply voltage is provided to the first output signal and the second output signal, and the first cross-coupled node and the fourth cross-coupled node are coupled to the ground.

9. The circuit as defined in claim 7, wherein when the control signal is at a low logic level and the reverse control signal is at a high logic level, the first N-type transistor, the third N-type transistor, the fifth N-type transistor, and the seventh N-type transistor are turned on and the first off transistor, the second off transistor, the third off transistor, and the fourth off transistor are turned off, so that the first latch circuit and the second latch circuit operate normally.

10. The circuit as defined in claim 4, wherein the first latch circuit further comprises:

a fifth off transistor, coupling the first output signal to the ground according to the control signal; and a sixth off transistor, providing the second supply voltage to the first cross-coupled node according to the reverse control signal;

wherein the second latch circuit further comprises:

a seventh off transistor, providing the second supply voltage to the fourth cross-coupled node according to the reverse control signal; and an eighth off transistor, coupling the second output signal to the ground according to the control signal.

11. The circuit as defined in claim 10, wherein when the control signal is at a high logic level and the reverse control signal is at a low logic level, the first N-type transistor, the third N-type transistor, the fifth N-type transistor, and the seventh N-type transistor are turned off, and the fifth off transistor, the sixth off transistor, the seventh off transistor, and the eighth off transistor are turned on, wherein the first output signal and the second output signal are coupled to the ground and the second supply voltage is provided to the first cross-coupled node and the fourth cross-coupled node.

12. The circuit as defined in claim 10, wherein when the control signal is at a low logic level and the reverse control signal is at a high logic level, the first N-type transistor, the third N-type transistor, the fifth N-type transistor, and the seventh N-type transistor are turned on and the fifth off transistor, the sixth off transistor, the seventh off transistor, and the eighth off transistor are turned off, so that the first latch circuit and the second latch circuit operate normally.

13. The circuit as defined in claim 4, wherein the first latch circuit further comprises:
   a ninth off transistor, coupling the first cross-coupled node to the ground according to the control signal;
   wherein the second latch circuit further comprises:
   a tenth off transistor, coupling the fourth cross-coupled node to the ground according to the control signal.

14. The circuit as defined in claim 13, further comprising:
   a choke transistor, providing the first supply voltage to the first input inverter and the third input inverter according to the control signal.

15. The circuit as defined in claim 14, wherein when the control signal is at a high logic level and the reverse control signal is at a low logic level, the first N-type transistor, the third N-type transistor, the fifth N-type transistor, and the seventh N-type transistor are turned off, and the ninth off transistor and the tenth off transistor are turned on to couple the first cross-coupled node and the fourth cross-coupled node to the ground.

16. The circuit as defined in claim 15, wherein when the first input signal and the second input signal are at the high logic level, the choke transistor is turned off according to the control signal at the high logic level, and the first reverse input signal and the third reverse input signal are at the low logic level and the second reverse input signal and the fourth reverse input signal are at the high logic level.

17. The circuit as defined in claim 15, wherein when the control signal is at a low logic level and the reverse control signal is at a high logic level, the first N-type transistor, the third N-type transistor, the fifth N-type transistor, the seventh N-type transistor, and the choke transistor are turned on, and the ninth off transistor and the tenth off transistor are turned off, so that the first latch circuit and the second latch circuit operate normally.

18. The circuit as defined in claim 1, further comprising:
   a ninth N-type transistor, comprising a source terminal, a gate terminal, and a drain terminal, wherein the source terminal and the gate terminal are coupled to the ground;
   a tenth N-type transistor, comprising a source terminal, a gate terminal, and a drain terminal, wherein the source terminal and the gate terminal are coupled to the drain terminal of the ninth N-type transistor, and the drain terminal is coupled to the first input signal;
   an eleventh N-type transistor, comprising a source terminal, a gate terminal, and a drain terminal, wherein the source terminal and the gate terminal are coupled to the ground; and
   a twelfth N-type transistor, comprising a source terminal, a gate terminal, and a drain terminal, wherein the source terminal and the gate terminal are coupled to the drain terminal of the eleventh N-type transistor, and the drain terminal is coupled to the second input signal.

* * * * *